United States Patent
Kim et al.

(10) Patent No.: US 8,018,285 B2
(45) Date of Patent: Sep. 13, 2011

(54) STEP VARIABLE GAIN AMPLIFIER

(75) Inventors: Moon Sun Kim, Suwon-si (KR); Yoo Sam Na, Seoul (KR)

(73) Assignee: Samsung Electro-Mechanics Co., Ltd., Gyunggi-do (KR)

( * ) Notice: Subject to any disclaimer, the term of this patent is extended or adjusted under 35 U.S.C. 154(b) by 14 days.

(21) Appl. No.: 12/614,279

(22) Filed: Nov. 6, 2009

(65) Prior Publication Data

US 2011/0025421 A1    Feb. 3, 2011

(30) Foreign Application Priority Data

Jul. 28, 2009    (KR) .................. 10-2009-0068984

(51) Int. Cl.
*H03G 3/30*    (2006.01)
(52) U.S. Cl. ........................ 330/284; 330/278
(58) Field of Classification Search .............. 330/284, 330/295, 124 R, 254, 278, 311
See application file for complete search history.

(56) References Cited

U.S. PATENT DOCUMENTS 7,649,418 B2 *   1/2010   Matsui ........................... 330/284
7,667,542 B2 *   2/2010   Kasha et al. .................. 330/284

FOREIGN PATENT DOCUMENTS

KR    10-2006-0038250 A    5/2006
KR    10-2007-0067550 A    6/2007

* cited by examiner

*Primary Examiner* — Hieu P Nguyen
(74) *Attorney, Agent, or Firm* — Lowe, Hauptman, Ham & Berner, LLP

(57) ABSTRACT

Disclosed is a step variable gain amplifier for linearly amplifying a signal received from an antenna. The step variable gain amplifier includes: an amplification unit for converting and amplifying a voltage component of a received signal into a current voltage according to a step amplification control signal; a controller for generating a step amplification control signal of the received signal and controlling on/off of the amplification unit according to the control signal; and an output unit connected to the amplification unit, the output unit outputting a voltage component from the signal that has been subjected to conversion into the current component and amplification processes.

4 Claims, 3 Drawing Sheets

[FIG. 1]
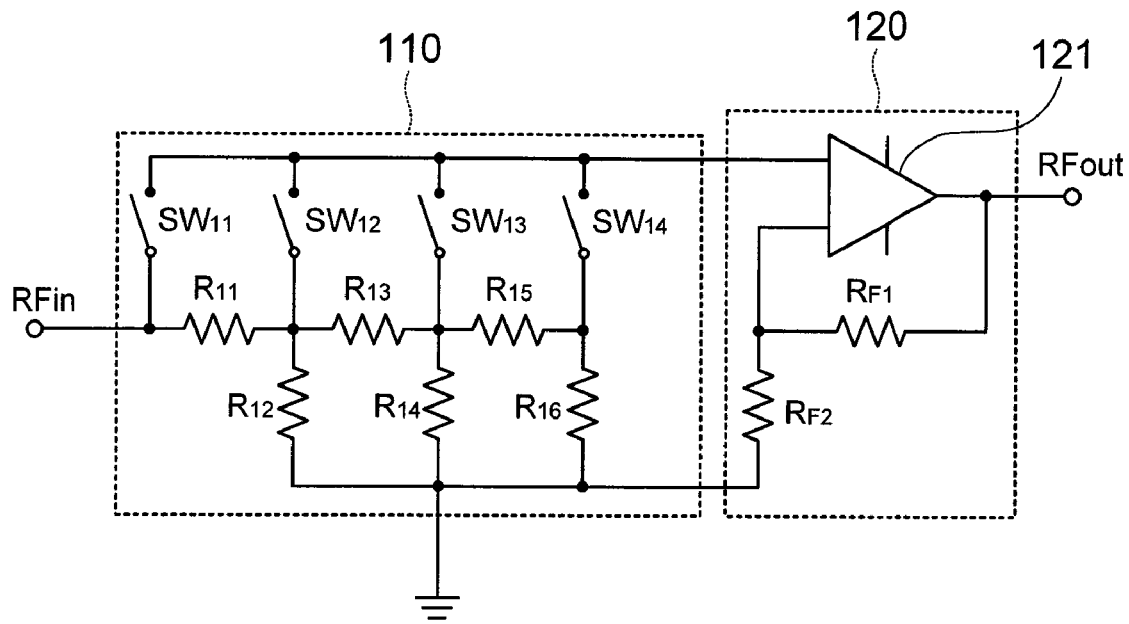
- PRIOR ART -
[FIG. 2]
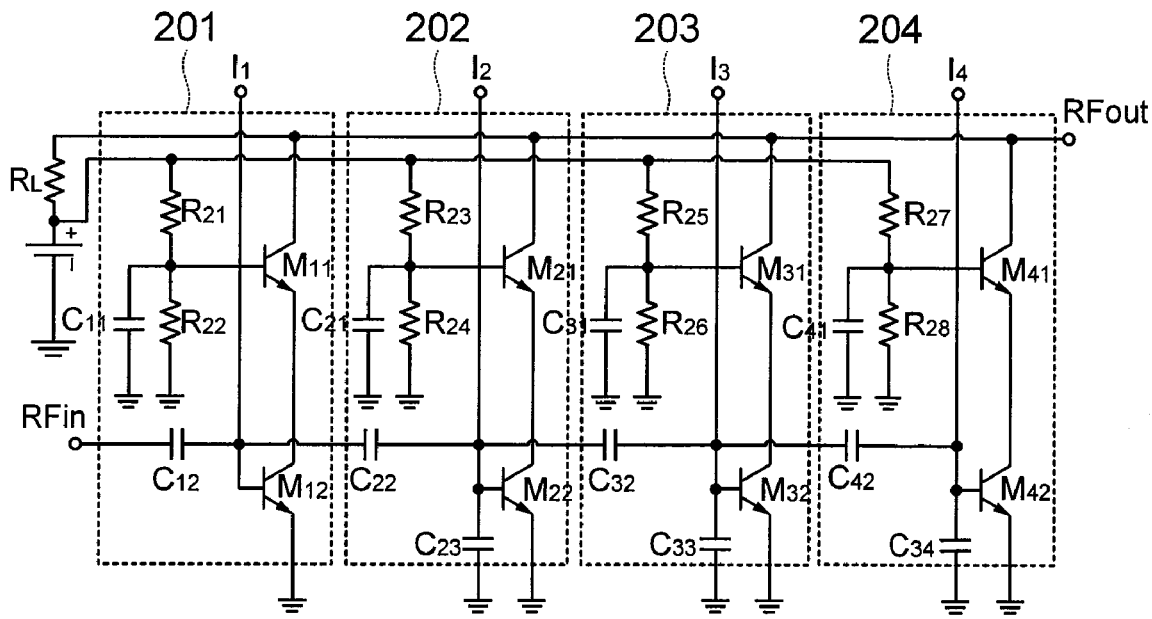
- PRIOR ART -

[FIG.3]
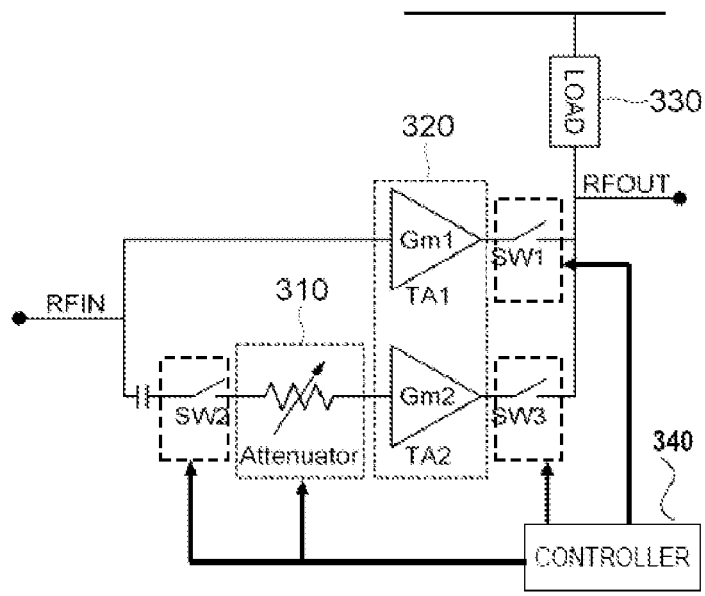
[FIG.4]
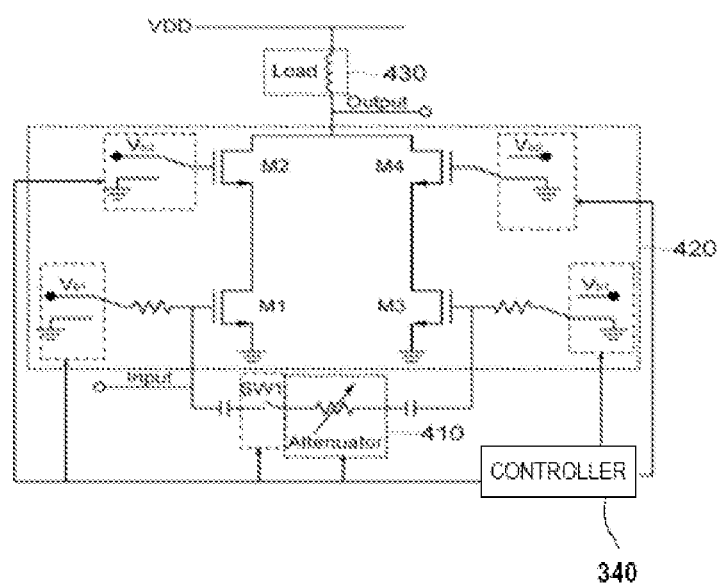

[FIG. 5A]
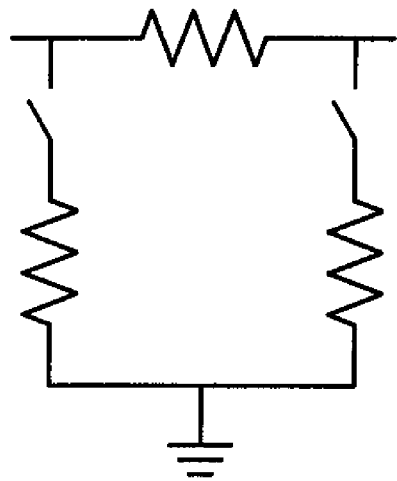
[FIG. 5B]
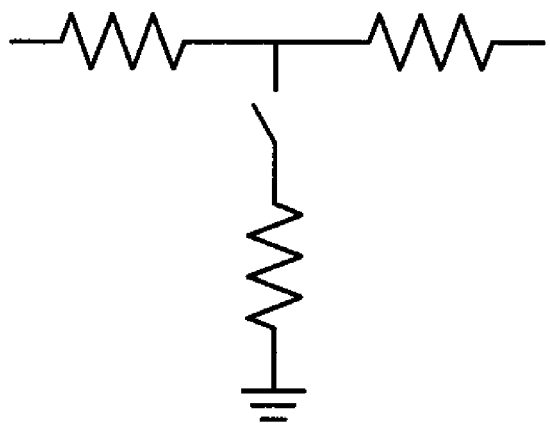
[FIG. 5C]
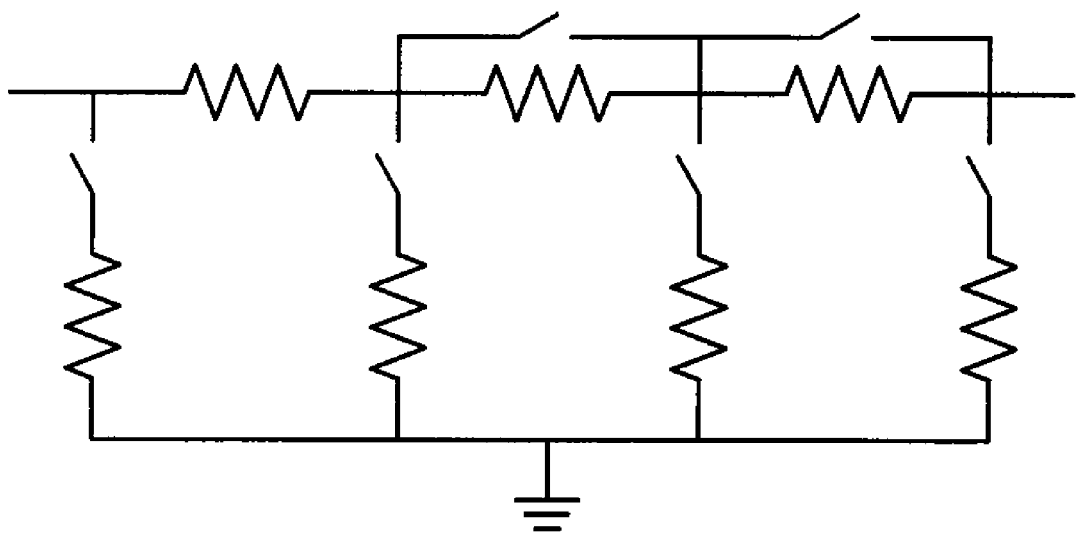

STEP VARIABLE GAIN AMPLIFIER

CROSS-REFERENCE TO RELATED APPLICATIONS

This application claims the benefit of Korean Patent Application No. 10-2009-0068984 filed with the Korea Intellectual Property Office on Jul. 28, 2009, the disclosure of which is incorporated herein by reference.

BACKGROUND OF THE INVENTION

1. Field of the Invention

The present invention relates to a step variable gain amplifier for amplifying an amplification rate of a voltage component of a signal received from an antenna according to each of gain modes by using two transconductance amplifiers, an attenuator, and at least one switching device.

2. Description of the Related Art

Recently, the line of products are being developed that can perform multifunction by transmitting and receiving specific information in either a mobile communication system, or a digital TV.

However, the amplitude of a transmission signal generated during the process is distorted according to a transmission device, a transmission condition, or channel characteristics, and thus such a distorted signal fails to meet linear characteristics of a system.

A method for reducing distortion characteristics of a signal is to adjust the amplitude of an initially transmitted signal by varying the amplitude of the signal again so that optimal signal processing can be implemented. The amplitude of this signal can be adjusted through a variable gain amplifier.

That is, the variable gain amplifier positioned at the front stage of a wireless communication device and a broadcasting receiver is called a low-noise amplifier. A noise figure of the low-noise amplifier is very important because it is a factor for determining noise figures of all receivers.

The amplitude of received communication or broadcasting signals ranges from a very small signal to a large signal. When a large signal is received, the low-noise amplifier needs to reduce a gain and attenuate the received signal in order to ensure linearity of the whole system.

There is a method for controlling a gain in multi-steps in front stage of an amplifier as a method to attenuate the signal.

FIG. 1 is a circuit diagram of a discrete-step gain switch amplifier using a conventional switch.

As shown in FIG. 1, the discrete-step gain switch amplifier circuit using the conventional switch includes a switch attenuation unit 110, and a fixed gain unit 120. The switch attenuation unit 110 includes switches SW11 to SW14, resistors R11 to R16, and an output terminal.

The fixed gain unit 120 includes an amplifier 121, resistors Rf1 and Rf2, and an output terminal, and an output terminal of the switch attenuation unit 110 is interconnected to an input terminal of the fixed gain unit 120.

In the case where all switches SW11 to SW14 of the switch attenuation unit 110 are switched off, a circuit fails to be configured even if an input signal is applied to the switch attenuation unit 110. Therefore, no amplification of signal is made in the amplifier 121 of the fixed gain unit 120, resulting in no output.

In the case where the switch SW11 of the switch attenuation unit 110 is switched on for configuration of the circuit, an input signal is applied to a first input terminal of the fixed gain unit 120, and an output terminal of the switch attenuation unit 110 is connected to a second input terminal of the fixed gain unit 120 by composite resistance of resistors R11 to R16.

By turning on/off the switches SW11 to SW14 of the switch attenuation unit 110, the gain of the amplifier 121 of the fixed gain unit 120 can be changed.

In a low gain, an effect of the noise figure is weak since the switch attenuation unit 110 is arranged at the input terminal of the fixed gain unit 120. However, in a high gain, amplification and conversion operation of the amplifier 121 of the fixed gain unit 120 cause switching devices to be driven, so a switching noise and a thermal noise resulting from the switching devices are produced within the amplifier 121. Therefore, the noises are added to a signal and accordingly, a noise figure is deteriorated.

FIG. 2 is a circuit diagram of a variable gain low noise amplifier in which the conventional amplifiers are connected in parallel to one another.

As shown in FIG. 2, the circuit of the variable gain low noise amplifier in which the conventional amplifiers are connected in parallel to one another includes first to fourth selection units 201 to 204, a power supply unit, and input and output terminals.

The first selection unit 201 includes capacitors C11 and C12, transistors M11 and M12, resistors R21 and R22 for driving, and the second selection unit 202 includes capacitors C21, C22, and C23, transistors M21 and M22, and resistors R23 and R24 for driving.

Further, the third selection unit 203 includes capacitors C31, C32, and C33, transistors M31 and M32, and resistors R25 and R26 for driving, and the fourth selection unit 204 includes capacitors C41, C42, and C43, transistors M41 and M42, and resistors R27 and R28 for driving.

When a current I1 is applied to the base of the transistor M12 of the first selection unit 201, a current between the collector and the emitter of the transistor M12 is amplified and flows, and a current between the collector and the emitter of the transistor M11 flows. Thus, a gain of the current is determined by the capacitor C12.

When a current I2 is applied to the base of the transistor M22 of the second selection unit 202, the transistor M22 is turned on, and a gain is determined by a ratio of two capacitors C22 and C23 connected to the transistor M22 as a current between the collector and the emitter of the transistor M22 flows.

An operation principle of the third or the fourth selection units 203 or 204 is also the same as the above-described method.

However, parallel connection of amplification devices and applying of a current for gain selection results in deterioration of a bandwidth. Further, since a current is applied for a variable gain, the total consumption power is increased.

SUMMARY OF THE INVENTION

The present invention has been proposed in order to overcome the above-described problems and it is, therefore, an object of the present invention to provide a step variable gain amplifier, which can perform step-variable amplification for a signal received from an antenna according to gain modes, amplify the received signal without passing through switching devices at the time of a high gain mode, and acquire an output voltage from one load element connected to an output terminal thereof by converting and amplifying a voltage component of the received signal into a current component.

In accordance with one aspect of the present invention to achieve the object, there is provided a step variable gain amplifier including: an amplification unit for converting and amplifying a voltage component of a received signal into a current voltage according to a step amplification control signal; a controller for generating a step amplification control signal of the received signal and controlling on/off of the amplification unit according to the control signal; and an output unit connected to the amplification unit, the output unit outputting a voltage component from the signal that has been subjected to conversion into the current component and amplification processes.

Preferably, the amplification unit has a configuration in which a first transconductance amplifier and a second transconductance amplifier are interconnected in parallel to each other.

Preferably, the input terminals of the first and second transconductance amplifiers are connected to a reception terminal for receiving a signal.

Preferably, the input terminal of the first transconductance amplifier is directly connected to the reception terminal, and at least one switching device and an attenuator are connected between the input terminal of second transconductance amplifier and the reception terminal.

Preferably, the attenuator includes resistors connected in series or in parallel to one other, and at least one switching device.

Preferably, the first transconductance amplifier includes first and second transistors, and the second transconductance amplifier includes third and fourth transistors.

Preferably, a driving signal input terminal of the first transistor included in the first transconductance amplifier is directly connected to the reception terminal for receiving a signal, and a switching device and an attenuator are connected between a driving signal input terminal of the third transistor included in the second transconductance amplifier and the reception terminal.

Preferably, at the time of a high gain mode operation, the first and second transistors are turned on, and the third and fourth transistors are turned off.

Preferably, at the time of a middle gain mode operation or a low gain mode operation, a switching device connected between the driving signal input terminal of the third transistor and the reception terminal is switched on, the first and second transistors are turned off, and the third and fourth transistors are turned on.

Preferably, the middle gain mode or the low gain mode is determined by an attenuation ratio of an attenuator connected between the driving signal input terminal of the third transistor and the reception terminal.

Preferably, the amplified received signal is detected by measuring a voltage component of the output unit connected to the output terminal of the amplification nit.

Preferably, the output terminal includes one load element which has a first terminal commonly connected to an output terminal of the amplification unit and a second terminal connected to a power supply.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which:

FIG. 1 is a circuit diagram of a discrete-step gain switch amplifier using conventional switches;

FIG. 2 is a circuit diagram of a variable gain low noise amplifier in which conventional amplifiers are connected in parallel to one another;

FIG. 3 is a circuit diagram showing schematically a step variable gain amplifier in accordance with an embodiment of the present invention;

FIG. 4 is a circuit diagram showing a step variable gain amplifier in accordance with an embodiment of the present invention; and FIGS. 5A to 5C are circuit diagrams showing an attenuator used in the step variable gain amplifier in accordance with an embodiment of the present invention.

DETAILED DESCRIPTION OF THE PREFERABLE EMBODIMENTS

Embodiments of a step variable gain amplifier in accordance with the present invention will be described in detail with reference to the accompanying drawings. When describing them with reference to the drawings, the same or corresponding component is represented by the same reference numeral and repeated description thereof will be omitted.

FIG. 3 is a circuit diagram showing schematically a step variable gain amplifier in accordance with an embodiment of the present invention, and FIG. 4 is a circuit diagram of a step variable gain amplifier in accordance with an embodiment of the present invention.

As shown in FIG. 3, the step variable gain amplifier includes switching devices SW1, SW2, and SW3, an amplification unit 320, a controller (340), and an output unit 330, and can be set in various step modes of two steps or more.

The step variable gain amplifier in accordance with an embodiment of the present invention has gain modes of three steps, that is, a high gain mode, a middle gain mode, and a low gain mode.

The amplification unit 320 of the step variable gain amplifier converts and amplifies a voltage component of a signal RFIN received through an antenna into a current component according to a step amplification control signal. The amplification unit 320 has a configuration in which a first transconductance amplifier TA1 and a second transconductance amplifier TA2 may be connected in parallel to each other.

The input terminals of the first and second transconductance amplifiers TA1 and TA2 are connected to a reception terminal RFIN for receiving a signal through an antenna, an input terminal of the first transconductance amplifier TA1 is directly connected to the reception terminal, and at least one switching device SW2 and the attenuator 310 are connected between the input terminal of the second transconductance amplifier TA2 and the reception terminal RFIN.

The transconductance amplifier refers to an amplifier for converting a voltage into a current.

As shown in FIG. 4, the first transconductance amplifier TA1 includes first and second transistors M1 and M2, and the second transconductance amplifier TA2 includes third and fourth transistors M3 and M4.

A reception terminal INPUT for receiving a signal through an antenna is directly connected to a driving signal input terminal of the first transistor M1 included in the first transconductance amplifier, and the switching device SW1 and the attenuator 410 are connected between the reception terminal INPUT and a driving signal input terminal of the third transistor M3 included in the second transconductance amplifier.

Hereinafter, a description will be given of a method for driving the step variable gain amplifier according to the high gain mode, the middle gain mode, and the low gain mode, in connection with an internal circuit configuration of the transconductance amplifier.

First, it is determined which one of the first and second transconductance amplifiers is to be driven according to the high gain mode and the middle/low gain mode.

In the case of the high gain mode operation, the first and second transistors M1 and M2 are turned on, and the third and fourth transistors M3 and M4 are turned off.

When the first and second transistors M1 and M2 are turned on, a constant voltage Vb1 or Vb2 is applied to the bias of the transistor; and, when the first and second transistors M1 and M2 are turned off, the bias of the transistor is connected to a ground.

The first transistor M1 is arranged in a common source configuration and plays a role of amplifying a signal, and the second transistor M2 is arranged in a common gate configuration and plays a role of increasing a gain by insulating the input and output.

Since the driving signal input terminal of the first transistor M1 is directly connected to the reception terminal for receiving a signal received through an antenna, instead of the switching device, it is possible to improve characteristics of a noise figure.

Further, the third and fourth transistors M3 and M4 are turned off, and thus it is possible to block the feedback of an output signal to an input terminal.

In the case of the middle gain mode operation or the low gain mode operation, a switching device SW1 connected between a driving signal input terminal of the third transistor M3 and a reception terminal INPUT is switched on, the first and second transistors M1 and M2 are turned off, and the third and fourth transistors M3 and M4 are turned on.

That is, when the switching device SW1 connected between the driving signal input terminal of the third transistor M3 and the reception terminal INPUT is switched on, a signal received from an antenna is transferred in order of the switching device SW1, the attenuator 410, the third transistor M3, and the fourth transistor M4, and a load, and then an output voltage is generated.

A method for driving the circuit in the middle/low gain mode is the same as that of the high gain mode, but there is a difference in the fact that the switching device SW1 and the attenuator 410 connected to the input terminal of the third transistor M3 reduce the amplitude of the signal received from the antenna, so that it is possible to reduce an overall gain.

That is, the middle gain mode or the low gain mode is determined by an attenuation ratio of the attenuator 410 connected between the driving signal input terminal of the third transistor M3 and the reception terminal INPUT. The attenuator 410 may include resistors connected in series or in parallel to one other, and at least one switching device.

FIGS. 5A to 5C are circuit diagrams showing an attenuator used in the step variable gain amplifier in accordance with the embodiment of the present invention.

As shown in FIGS. 5A to 5C, the attenuator may be configured to be in various types, such as π-type, T-type, ladder-type, and so on. The control of the attenuator can be made by turning on/off each of switching devices according to the attenuation ratio.

A controller (340) generates a step amplification control signal of the signal received from the antenna and controls on/off of the amplification unit according to the control signal. The output units 330 and 430 are connected to the amplification unit, and output a voltage component from a received signal that has been subjected to conversion into a current component and amplification processes.

The output units 330 and 430 may include one load element, which has a first terminal commonly connected to an output terminal REOUT of the amplification unit 320 and an output terminal OUTPUT of the amplification unit 420, and a second terminal connected to a power supply VDD, respectively.

The output units 330 and 430 connected to the output terminal REOUT or OUTPUT of the amplification units measure and outputs a voltage component of both terminals of the load element.

Although it has been illustrated that the step variable gain amplifier operates in three-step gain mode in the embodiment of the present invention, a circuit can be implemented to have various-step gain mode at the time of actually implementing the circuit. Herein, the various-step gain mode may be implemented in the attenuator.

In the embodiment of the present invention, since a signal received from an antenna is directly inputted to an amplifier without passing through the switching device at the time of the high gain mode operation, it is possible to improve a noise figure of the variable gain amplifier.

Further, since a current used in a variety of variable gain modes is no changed, it is possible to uniformly maintain the bandwidth in a variety of variable gain modes.

Furthermore, a spiral inductor used in a general low-noise amplifier is commonly used regardless of variable gain modes, and thus it is possible to downsize the circuit and to reduce costs.

As described above, although the preferable embodiments of the present invention have been shown and described, it will be appreciated by those skilled in the art that substitutions, modifications and variations may be made in these embodiments without departing from the principles and spirit of the general inventive concept, the scope of which is defined in the appended claims and their equivalents.

What is claimed is:

1. A step variable gain amplifier, comprising:
an amplification unit for converting and amplifying a voltage component of an input signal into a current component according to a step amplification control signal, wherein the amplification unit has a first transconductance amplifier and a second transconductance amplifier interconnected in parallel to each other, the first transconductance amplifier includes first and second transistors interconnected in series to each other, and the second transconductance amplifier includes third and fourth transistors interconnected in series to each other;
a controller for generating the step amplification control signal and controlling on/off of the amplification unit according to the step amplification control signal;
at least one first switching device and an attenuator connected between a driving signal input terminal of the third transistor and a reception terminal for receiving the input signal; and
an output unit for outputting a voltage component corresponding to the current component, the output unit being connected to the amplification unit,
wherein a driving signal input terminal of the first transistor is directly connected to the reception terminal,
wherein, in a high gain mode operation, the controller is configured to turn on the first and second transistors and to turn off the third and fourth transistors,
wherein, in a middle or low gain mode operation, the controller is configured to switch on the at least one first switching device, to turn off the first and second transistors, and to turn on the third and fourth transistors, and
wherein the middle or low gain mode operation is determined by an attenuation ratio of the attenuator.

2. The step variable gain amplifier of claim 1, wherein the attenuator includes resistors connected in series or in parallel to one another, and at least one second switching device connected to the resistors, for a determination of the attenuation ratio.

3. The step variable gain amplifier of claim 1, wherein the amplified input signal is detected by measuring the voltage component of the output unit connected to an output terminal of the amplification unit.

4. The step variable gain amplifier of claim 1, wherein the output unit includes one load element which has a first terminal connected to an output terminal of the amplification unit and a second terminal connectable to a power supply.

* * * * *